United States Patent [19]

Fisher

[11] 4,415,853
[45] Nov. 15, 1983

[54] MONITORING DEVICE AND METHOD FOR ACCURATELY DETERMINING AND RECORDING PRESENT DEMAND OF ELECTRICAL ENERGY

[76] Inventor: Berish M. Fisher, 629 Ave. M, Brooklyn, N.Y. 11210

[21] Appl. No.: 199,386

[22] Filed: Oct. 21, 1980

Related U.S. Application Data

[63] Continuation-in-part of Ser. No. 940,458, Sep. 8, 1978, abandoned.

[51] Int. Cl.³ .................... G01R 35/04; G01R 11/64
[52] U.S. Cl. ............................ 324/74; 324/103 R; 324/113; 346/14 MR
[58] Field of Search ............ 324/103 R, 113, 74; 346/79, 30, 14 MR

[56] References Cited

U.S. PATENT DOCUMENTS

| | | | |
|---|---|---|---|
| 1,090,413 | 3/1914 | Rhodes | 346/14 MR |
| 2,950,159 | 8/1960 | McCulley et al. | 346/79 |
| 3,380,064 | 4/1968 | Norris et al. | 324/113 |
| 4,120,031 | 10/1978 | Kincheloe et al. | 324/113 |

*Primary Examiner*—Ernest F. Karlsen
*Attorney, Agent, or Firm*—Israel Nissenbaum

[57] ABSTRACT

A monitoring device and method for determining the present demand of electrical energy consumed over a predetermined time period which includes an adjustable reflective scanner or sensor mounted exteriorly of an electric meter for sensing and determining the speed of the rotating disc of a conventional electric meter. The arrangement is such that the scanner or sensor detects the revolutions of the meter disc and emits a signal or signals which are amplified and fed into a counting device which includes a memory and in conjunction with a printer prints the time of day, the date (at midnight) and the number of revolutions of the rotating meter disc which is stored as recorded in memory for a given unit of time. The counting device, memory and printer are embodied in a printing calculator interfaced with timing and scanning means.

12 Claims, 6 Drawing Figures

MONITORING DEVICE AND METHOD FOR ACCURATELY DETERMINING AND RECORDING PRESENT DEMAND OF ELECTRICAL ENERGY

This is a continuation-in-part of U.S. Ser. No. 940,458 filed Sept. 8, 1978, now abandoned.

This invention relates to optical scanning measurements of electric meters.

Heretofore, considerable difficulties have been encountered in accurately determining the amount of electrical energy which is presently being consumed by a given consumer of electricity. While electrical meters are connected in a line to measure the amount of electrical energy beng consumed such meters frequently partially malfunction; and therefore, fail to accurately measure the demand or actual electrical energy consumed. The measurement of total electrical consumption however usually remains accurate.

For example, certain types of meters utilized to measure the amount of electrical energy being consumed by an industrial consumer include a built-in memory device, or peak demand meter, to record the duration of peak load operation, as an industrial consumer is charged a premium for a peak demand of electrical energy over a continuous predetermined time interval. Normally, such memory devices are mechanically activated and are designed to be reset, generally by cam movement, if peak demand requirements are not maintained for the predetermined continuous time interval. However, it has been observed that such memory devices frequently malfunction; i.e. they fail to reset with the cam sticking and remaining in position even if the peak demand is not maintained for the sustained predetermined time interval. As a result, such malfunctioning peak demand meters will undetectably cumulate the peak load demand periods for less than the sustained time interval, thereby causing such industrial users to be overcharged by the operating utility. That is, an industrial user would be charged the premium rate for supposedly using a certain peak amount of electrical energy even though he has in fact not used this amount of electrical energy. Because such malfunctioning peak demand meters are difficult to detect, especially since the direct electric usage meter remains unaffected and accurate, an industrial user is generally not aware of the errors incurred thereby, and of the overcharges being made.

An object of this invention is to provide an apparatus and method of detecting and recording the actual present demand of electrical energy being used for a predetermined time interval.

Another object of this invention is to provide a printed record of the amount of electrical energy consumed over a given time period corresponding to or less than peak demand electric usage periods as determined by the regulatory agency.

Another object is to provide an apparatus which is capable of monitoring an electric meter so as to insure the accuracy of such meter.

Another object is to provide an apparatus in which an inexpensive printing calculator is interfaced with detecting and timing means in order to provide the counting, memory and print out functions of the present invention.

Another object is to provide an entirely exteriorly mounted monitoring device for use in conjunction with an electric meter for ascertaining and recording the present demand of electrical energy consumed.

The foregoing objects and other objects, features and advantages of the present invention will become more readily apparent when considered in view of the drawings and specification in which.

Figure 5:
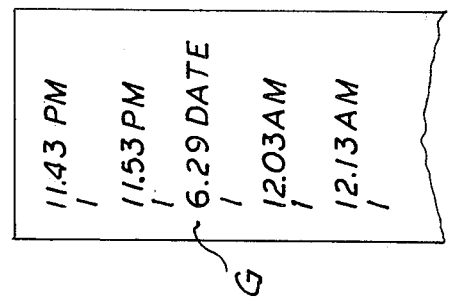
FIG. 5 is a facsimile of another portion of a tape print out.

The foregoing objects and other features of this invention are attained by a monitoring device which includes an adjustable reflective scanner mounted exteriorly of an electric meter capable of directing a beam of light onto the rotating disc of the electric meter. The scanner includes an electronic detecting device to detect any change in the reflective index caused by the marking on the meter disc as it passes under the light beam. When the change of reflective light occurs on each revolution of the meter disc, the detecting device will emit a signal or pulse which is directed to an electronic control unit. Because of the exterior position (up to 4 inches from the disc) of the scanner it contains adjustable controls for optimal reflected light scanning. The signal must additionally be amplified before it can be directed to the electronic control unit. This is in contrast to some prior art optical scanners such as in U.S. Pat. No. 3,943,498 which provides such scanners directly within the meter adjacent the meter disc and as an integral part of the meter.

The electronic control unit includes a power source for energizing the scanner light beam, as well as a counter for counting the revolutions of the meter disc and a memory for storing the number of revolutions of the meter disc or pulses. A timer is also operatively connected which can be readily preset for any given time interval.

The arrangement is such that when the control unit receives a pulse or signal from the detector portion of the scanner, it is stored in the counter's memory so the number of revolutions made by the meter disc can be noted for any given time period. After a preset time interval, the timer of the control unit will emit a control signal which is directed to a printer connected in circuit, which will print a record indicating the time of day when the control signal was made, and the number of revolutions then stored in the counter's memory at the time the control signal was given. By taking any two time periods and calculating the time interval, eg, in seconds and then calculating the difference between the printed amounts of the revolutions of the disc for the respective two time periods; one can calculate the average time for one full revolution of the disc for such time interval, in other words, the average speed of the disc for such time interval.

Another method of measuring the speed of the disc, would be to mount two of the above described reflective scanners within a predetermined angle of less than 360 degrees, of each other. Thus, when the marking on the meter disc passes the first scanner it emits a control signal which starts a timer. When the marking on the meter disc passes the second scanner it emits another control signal which stops the timer and is also directed to a printer—to print the timer interval between these two control signals; i.e. the time recorded in the timer in seconds and fractions of a second. Thus, we can determine the speed of the disc in less than one full revolution. As an example; Assume that the angular distance between the scanners is 60°. Thus 360°/60°=6. If the recorded time interval between the two signals is two seconds, then the time for one full revolution is 2×6=12 seconds. Thus, the speed is 12 seconds/revolution.

The speed of the disc can also be determined in the following manner. We use only one scanner. When the beginning of the mark on the revolving disc comes under the scanner, it starts a control signal. As long as this mark is under the scanner, this signal is present. When the end of the mark leaves the scanner's field, the signal stops. Now going back when the signal starts—it starts a timer. As long as the signal is present, the timer is running. When the signal stops the timer stops. Also when this signal stops it generates a different timing control signal to the printer, to print the time interval. This timing signal also resets the timer. By measuring the width of the mark on the disc, in degrees; we can determine the speed of the disc during every full revolution. As an example: Assume that the width of the mark on the disc, in degrees, is 15°. 360°/15°=24. If the time interval of the passing mark is ½ second then 24×½=12 seconds. Thus, the speed of the disc is 12 seconds/revolution.

In a similar manner we can determine the timer interval between the end of the mark and the beginning of the mark; i.e. 360°−15°=345°. We measure the whole empty space on the disc except for the mark.

In a similar manner, we can determine the time interval of one full cycle of the disc—by starting the timer at the beginning of the mark, letting the disc rotate 360 degrees, and then stopping the timer when the beginning of the mark appears again. At this instant we store the numeric value of the time interval, in memory and at the same time reset the timer. We can then print the contents in the memory.

This invention contemplates a method of monitoring an electric meter so as to provide a check on such meter and to assure that it is accurately determining the amount of electrical energy being used and charged for. This is attained by directing a reflective scanner 12 onto the rotating disc 10A of an electric meter so that a pulse signal is generated upon each change of reflective index due to the revolution of the disc 10A. The pulse signal thus produced is amplified and transmitted to a counter which has a memory for retaining the number of times such pulse is generated. At regular predetermined time intervals (generally equal to or less than the local peak demand time periods), e.g., every ten (10) minutes a control signal is generated by a timer which is operatively connected to a printer for effecting a printed record of each regular time period as the time of day and the number of revolutions made by disc 10A during each recorded time interval. In this manner the precise speed or revolution per sec. of the meter disc can be precisely ascertained which when utilized in a predetermined rate formula will determine actual present demand over any given time period. The foregoing method can be practiced by an apparatus hereinafter described.

Figure 3:
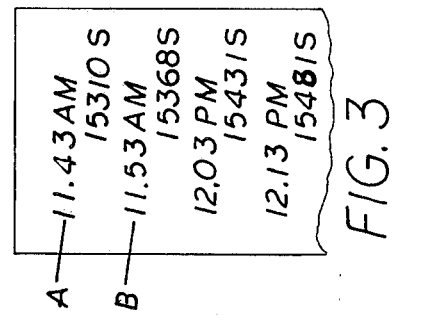
FIG. 3 is a facsimile of a tape print out.
Figure 1:
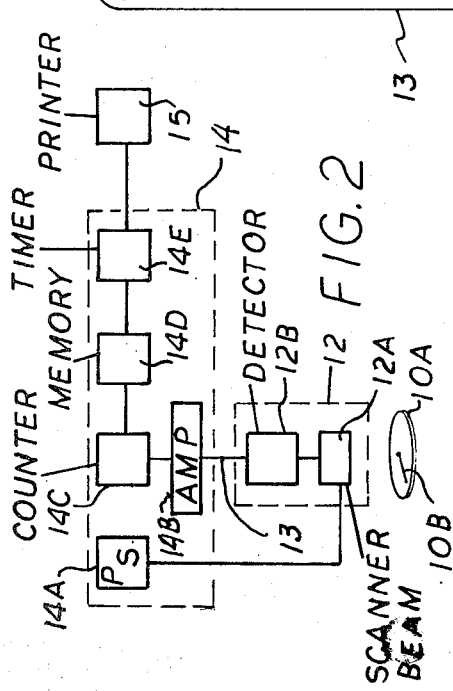
FIG. 1 is a pictorial illustration of an apparatus embodying the present invention.

Referring to the drawings, and more specifically to FIG. 1, there is illustrated an electrical meter 10 of conventional construction which is utilized for metering or measuring the amount of electrical energy consumed by a given consumer. Such a meter generally contains a rotating disc 10A which measures the amount of energy being consumed. In industrial meters there is also built thereinto a mechanical memory device to monitor the peak amount of electrical energy utilized by the consumer as such peak or heavy use of electricity over a continuous or sustained period of time which subjects the consumer to payment of a premium rate for energy consumed. In such meters, the memory is designed to be reset after A (see FIG. 3) predetermined sustained time interval, so that the higher rate is chargeable only if peak use occurs over a predetermined continuous time interval. For example, in New York City such period is thirty minutes. FIG. 3 shows a ten minute time interval. In other words, peak use of electrical energy over a time interval less than the continuous predetermined time period does not subject the consumer to the premium charge rate. As such memory devices are generally electromechanical (usually cam operated), they tend to stick or jam, and thus do not reset as is required when peak load or use occurs for less than the prescribed continuous time interval. When this occurs the memory will cumulate the less than prescribed time interval which will cause the meter to indicate falsely that the consumer utilized peak load consumption over the predetermined continuous time period thereby causing the consumer to be billed a rate greater that that the consumer should be charged. The consumer is in fact misled by the accuracy of the actual electrical usage part of the meter into believing that there is no malfunction of the peak demand part of the meter.

To obviate such difficulty and erroneous belief, the present invention contemplates mounting by the consumer (or electric supplier) adjacent the glass or plastic cover 11 of a meter 10 a reflective scanner 12. The reflective scanner includes a light source 12A which focuses a beam of light onto the rotating disc 10A of the meter 10. In the conventional meter 10, the speed of rotation of the disc 10A is directly proportional to the consumption of electrical energy. The more energy that is being consumed, the faster the disc 10A rotates. Also, such disc 10A has a marking or line 10B thereon which will mark one revolution of the disc.

In accordance with this invention, the scanner device 12 is mounted in such a manner that its light beam is directed onto the surface of the disc 10A so as to detect the presence of the marking or line 10B on the disc as it rotates. It will be noted that the scanner 12 is provided with a suitable, adjustable lens to focus the light beam onto the surface of the disc. The scanner 12 comprises a phototransistor surrounded by optical fibers through which light is transmitted. The adjustable lens covers the phototransistor and associated optical fibers for maximum reflective scanning. The surface of the disc 10A causes the light beam focused thereon to be reflected directly back through the lens where the reflected light is detected or sensed by an electronic sensing device (phototransistor) 12B contained within the scanner 12. (See FIG. 2.)

Scanners may be made available where the light source and the detecting device are not under the same lens, but are removed from each other by a distance; i.e. the light source and the detecting device are either two separate units or they are one unit but there is a distance between them. However as the distance between the scanner and the disc is increased it becomes increasingly preferable to integrate the light source and detecting device to avoid lost signals.

As the disc 10A rotates, the black line or marking 10B thereon is caused to pass under the focused light beam. When this occurs, the reflective index of the surface of the disc 10A changes and this change in the reflected light is sensed by the detecting device 12B in the scanner.

When this change (generally of the order of about 500 microA to 50 microA) in reflective light is sensed by the detector 12B, a signal or pulse is generated which is transmitted through a suitable electrical conductor 13 to an electronic controller 14.

Figure 2:
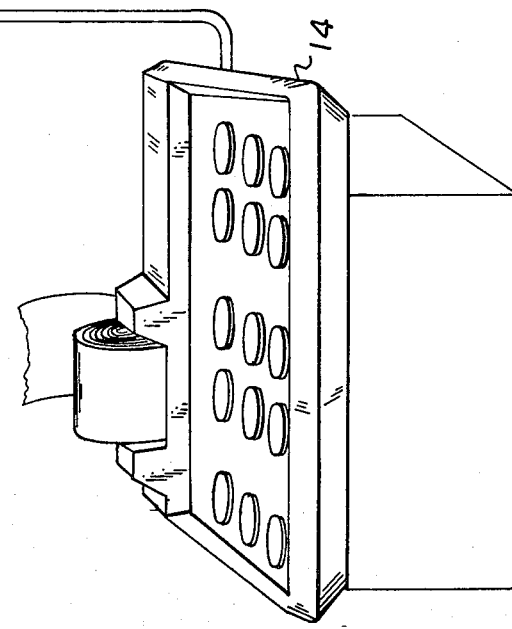
FIG. 2 is a schematic diagram of the invention.

As seen in FIG. 2, the electronic controller 14 includes a power source 14A operatively connected for supplying power to the scanner light source 12A. The controller 14 also includes an amplifier 14B for amplifying the signal received from the detector 12B (generally to a voltage change of from about 0 to 5 volts or 0 to 12 volts). Another portion of the controller 14 includes timer 14E, an electronic counter 14C and associated memory 14D. It will be understood that the timer 14E can be preset to indicate any predetermined time interval, i.e. from seconds to hours but is usually minutes in conformity with standard electric supplier peak demand periods.

Operatively connected in circuit with the controller unit 14 is a printer 15. The printer functions to provide running tape on which the printer records the time of day in hours and minutes each time the timer 14E emits a signal at the end of the preset time interval. The printer 15 will also indicate on tape the number of revolutions of the disc 10A then present in the counter's memory 14D. In the present invention the counter, memory and printer are all embodied within a single printing calculator which is operatively interfaced with the generated pulses or signals.

In operation, the power supply 14A of the controller unit 14, when activated, supplies the power for the reflective scanner 12 which focuses a beam of light onto the disc 10A. Upon each revolution of the disc 10A, the detector portion 12B of the scanner 12 i.e., a phototransistor, senses the change in the reflective index of the disc 10A due to the marking 10B thereof and cause a pulse or signal to be sent to the controller unit 14 wherein the pulse is amplified and recorded in the counter's memory. Thus, every time the controller unit 14 receives a pulse signal from the detector 12B, it is added to the content of the counter's memory. After a preset time interval of the timer 14E, the timer 14E will emit a control signal which is routed to the printer 15 to activate the printer 15. The printer 15 when thus activated will effect the printing on a tape of the time of day in hours and minutes each time such control signal is received, and also the number amount of disc revolutions then present in the counter's memory.

For example, if the timer was preset to generate a control signal every ten minutes, the printer 15 would be energized by the control signal emitted by the timer 14E every ten minutes and record on a continuous tape the time of day and the number of disc revolutions stored in the counter's memory 14D.

Accordingly, one can then easily calculate the time it takes for the disc to make one revolution. This is attained by taking any two time periods and calculating the time interval therebetween; e.g., in seconds. The difference in the printed number of revolutions of the disc recorded for the two time periods taken determines the number of revolutions made by the meter disc 10A for said time interval. Thus, if the difference in the two time periods is ten (10) minutes or 600 seconds, and the number of revolutions made by the disc 10A during this time period is 60; the average time for one revolution can be readily computed; i.e., ten seconds per revolution.

Knowing the number of disc revolutions per a given time interval, the amount of energy demanded in this time interval can be calculated by inserting this variable in a predetermined formula utilized by a particular Utility Company for computing the number of kilowatt hours of electricity demanded.

Also, knowing the number of disc revolutions per a given time interval, the amount of energy consumed in this time interval can be calculated by inserting this variable in a predetermined formula utilized by a particular Utility Company for computing the number of kilowatt hours of electricity consumed.

Figure 4:
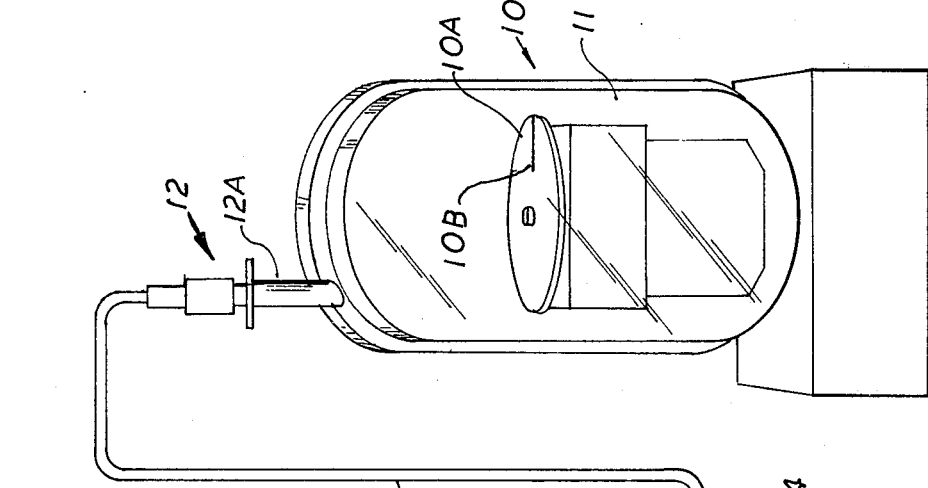
FIG. 4 is a facsimile of another portion of a tape print out.

FIGS. 3 to 5 illustrate a tape record as made by the printer 15.

Referring to FIG. 3, it will be noted that the time interval between any two recorded time intervals, i.e., A and B is ten (10) minutes or 600 seconds. The corresponding number of disc revolutions in the counter's memory for each of said time periods is also given. For example, for time period A the disc revolution showed 15310 and for period B 15368. Thus, in the ten minute time span interval between period A and B, the disc made 58 revolutions. Therefore, for this ten minute period, it took the disc 10.34 seconds to complete one revolution.

FIG. 4 illustrates another tape sequence for another time interval. The preset time interval is again ten (10) minutes or 600 seconds. The revolution difference between time period C and D is 49. Thus dividing the revolutions for the ten (10) minute period between time periods C and D into 600 seconds, it will be noted that for this period of time, it took 12.24 seconds per revolution. In a preferred embodiment only the number of revolutions themselves rather than a running subtotal is recorded for each time interval.

In the time period between E and F it will be noted that there is only the number 1. This indicates that the premises are closed for the night and that there is practically no use of electrical energy being made during this time period.

FIG. 5 shows a tape sequence to illustrate a date change, as indicated at G. It may be noted that AM, PM and S notations on the tape are for illustrative purposes and do not actually appear on the printed tape.

In the past, various optical scanning meter reading devices have been available. Generally such devices are contained directly within the meter as a part thereof and serve to notify electric users and/or electric suppliers of electric usage during billing periods. Since such scanning devices are integral parts of the electric meters they are not utilized in the manner of the present invention of measuring and recording electric usage for relatively small periods of time such as for peak demand periods since another part of the meter itself is designed for such function, i.e., the peak demand part of the meter. In fact the easily measured accuracy of the electric meter itself militates against perception of a malfunction of the peak demand part of the meter.

The optical scanning devices of the prior art have utilized as part of their recording system magnetic tapes or expensive thermal or mechanical printers. In the latter instance the printer is loaded initially with documents having preprinted data with respect to successive billing dates such as the date of reading as described in U.S. Pat. No. 3,380,064. Thus, in the prior art, print outs or recordations are generally initially set for predetermined periods of time with the actual recorded data being only the number of signals or pulses indicating usage or conversions thereof into monetary values. The present invention provides a means whereby an inexpensive printing calculator is interfaced with a timing system having both clock and calendar functions and wherein the calculator itself, with such interfacing, performs the functions of counter, memory (accumulator) and printer-printing date, time and number of signals or pulses.

The printing calculator must have several features in order for it to be operable in accordance with the present invention. Firstly it should have a cumulating capability such that upon repeated activation of a key thereof a previously entered number is repeatedly added to memory and optionally wherein printing of the contents of memory erases the memory. Secondly the calculator should have a means whereby upon entry of a number into the calculator it can be directly printed without performing a function upon it to alter it. A calculator having the requisite functions is printing calculator TI 5015 made by Texas Instruments Inc. which is hereinafter described as being illustrative of the present invention. The TI 5015 calculator has a "+" key which when activated cumulates a number previously placed into memory and a "T/GT" key which when activated once, prints out the cumulated total from memory and then erases it. The calculator additionally has a "#/s" key which when activated after a number is entered into the calculator will directly print such number. The TI 5015 calculator has the additional benefit of printing the cumulated total on the right hand side of the print out tape and the entered number upon the left hand side of the print out whereby different numerical printouts may be readily distinguished.

Figure 6:
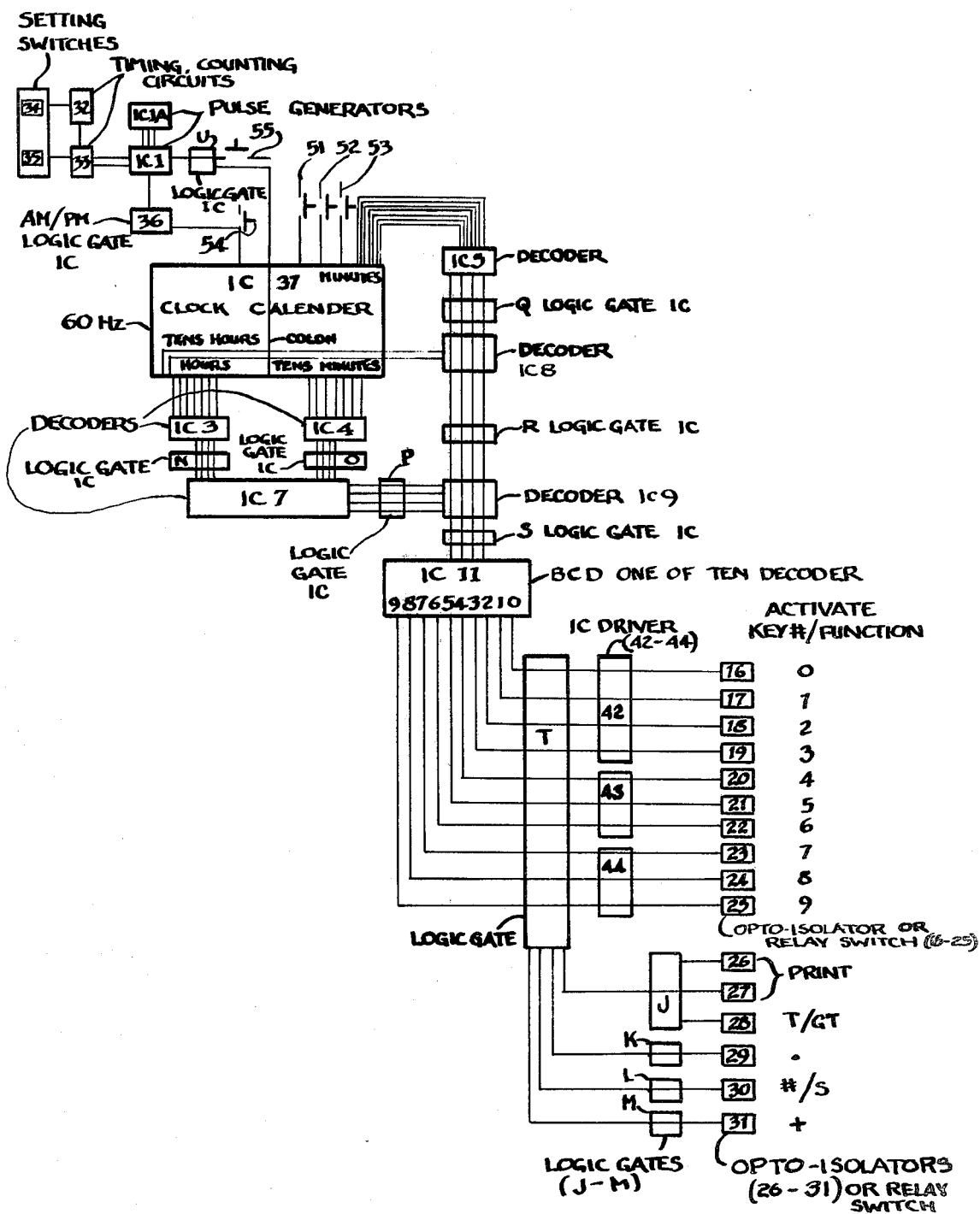
FIG. 6 is an electronic schematic of the operative association of signals interfaced with a printing calculator which provides counting, memory and printing functions.

FIG. 6 is a circuit diagram of the interfacing of both time and optical signal pulses with a printing calculator. Integrated circuit (IC) chip 37 provides the heart of the timing system and comprises a seven segment output clock/calendar non-multiplexed direct drive MOS IC. Since the system of the present invention is a printing one rather than a display system a binary coded decimal (BCD) output would have been preferred for such a logic system. However, commercially available BCD ICs are all multiplexed and provide problems in demultiplexing as would be required in the present invention and additionally may be subject to disruptions engendered by proximity to the synchronous motor in the electric meter to be monitored as well as other electrical interference. The output of IC 37 is decoded from the seven segment to BCD by means of decoding ICs 3,4 and 5 which decode the hours, tens minutes and minutes respectively. IC 8, through which the output of tens hours passes, need only handle two segments since only the unit digit is possible. ICs 7,8 and 9 with associated logic gate ICs multiplex the BCD inputs such that only one BCD output is at the IC 9 output. The output of IC 9 though logic gate IC S is applied to IC 11, a BCD to one-of-ten decoder which converts the BCD output to one of ten outputs. From IC 11 the signal is applied through logic gate IC T to IC drivers 42,43 and 44 to increase the driving power of the signal. From the appropriate drivers the signal is thereafter applied to the appropriate IC 16-25 each of which is an opto-isolator (or relay switch) directly hooked up to calculator keys 0-9 respectively. A signal is therefore applied to an appropriate opto-isolator which "presses" the appropriate number key.

Pushbuttons 51-53 set the appropriate actual time for the clock/calendar IC 37 and pushbutton 54 sets the appropriate calendar date. Pushbutton 54, when actuated displays the calendar date for two minutes on the display which then reverts to the time display.

Pulse generator IC 1A and 1, linked to the pulsating colon of the clock/calendar IC 37 serve to count and time appropriate timing functions such as the time for ordering a print out at a preset selected time period and are the program ICs. Such preset selected time period is effected by utilization of switches 34 and 35 which are connected to timing/counting circuits, ICs 32 and 33.

Logic ICs J,K,L and M are connected to opto-isolators (or relays) 28-31 which actuate calculator keys "T/GT", ".", "#/s" and "+" as shown in FIG. 6. Additionally Logic IC J is connected to opto-isolators 26 and 27 which control the print command function. These logic ICs gate the incoming signal to the appropriate key or operations as will be described.

Setting switches 34 and 35 sets the print out time period, typically for the peak demand time period such as 30 minutes in New York City. By pressing pushbutton 55 the sequence of the print out is initiated and after the printout is completed opto-isolator 17 is actuated and key "1" is "pressed". Pushbutton 55 is manually actuated at the very beginning of the operation of the monitoring device to ascertain proper entry of the time and to initiate the monitoring function.

Pulses which result from movement of the electric meter and change in the optical reflection are gated to opto-isolator 31 by the logic ICs to actuate calculator key "+". This key adds 1 to memory for each signal perceived since the 1 key was previously "pressed". As a result, the pulses obtained from the optical scanner is accumulated thereby and stored in memory until the preset time period is reached.

At the preset time period the ICs 32 and 33 signal program ICs 1 and 1A to turn the printer on, which printer was turned off during the scanning period. The printer then prints the time of day and the cumulated number of pulses. IC 1 is a pulse IC and together with IC 1A determine which BCD readout is transmitted to drive the opto-isolators and the sequence of commands to the printer.

The sequence during the print out after the initial triggering of program ICs 1 and 1A is:
(a) latching of ICs 26 and 27 to permit printing on command;
(b) the next pulse is gated by logic IC J to IC 28 which "presses" the "T/GT" key of the calculator. The subtotal accumulation in memory of the successive ones added upon each optical scan is printed and a new subtotal is started with the printing being on the right hand side of the tape;
(c) the next pulse transmits the tens hours digit (in the display) to the BCD output of IC 9 through IC 11 to the appropriate numerical key (either 1 or nothing). The number (if 1) is thereby loaded to be printed on command;

(d) the next pulse does the same for the unit hours digit;

(e) the next pulse through the logic gates K triggers opto-isolator 29 and the period key thereby loading a period to be printed on command;

(f) the tens minute digit is loaded to be printed on command as in c above (g) the units minute digit is loaded to be printed upon command as in c above;

(h) the next pulse is directed through logic gates L to opto-isolator 30 to trigger the "#/s" key whereby the entered number i.e. the time (tens hour, units hour, period, tens minute and units minute) is printed out one line below and to the left of the "number of pulses" previously printed;

(i) the next pulse triggers opto-isolator 17 to press the 1 key for future cumulations of optical signals; and (j) the next pulse sets program ICs 1 and 1A unlatching opto-isolators 26 and 27 to turn off the printer whereby the scanner again triggers the "+" key for further cumulations (during the printing cycle the scanner is locked out).

At midnight, IC 36, a logic gate that detects changes from PM to AM transmits a pulse through pushbuttons 54 by bridging the connection and resets ICs 1 and 1A to initiate the printing cycle but with the date (which is on the display because of the actuation of the calendar setting pushbutton 4 being printed instead of the time. With the aforementioned printed data, calculations can therefore be made with regard to the actual usage of electricity within given peak demand time periods whereby the accuracy of the peak demand portion of an electric meter may be readily determined.

From the foregoing method and apparatus for practicing the method, it will be noted that a printed record is made for any given period of time; e.g., a billing period whereby it can be readily ascertained by a customer or consumer what the electric demand has been for the billing period or any fractional portion of the billing period. In this manner, a consumer can readily compute his own electrical charges and thereby verify any billing issued by a utility. Also, the record will enable a consumer an opportunity to maintain accurate control over the consumption of electric energy, enabling the consumer to equalize the energy consumption over a time period and thereby conserve such energy.

While the foregoing invention has been described with respect to a particular embodiment thereof, variations and modifications can be made without departing from the spirit or scope of the invention.

What is claimed is:

1. A device for monitoring peak demand electric usage from an electric usage meter having a rotating disc and a peak demand meter integrated therewith, said peak demand meter being mechanically activated and designed to be reset if said peak demand electric usage is not maintained for a predetermined continuous time interval, said device comprising means for sensing rotation of said disc, timing means, and a printing calculator containing counting, memory and printing means, said counting means being adapted to receive signals from said sensor and to count rotations of said disc, and said memory means retaining a cumulated total of said counted rotations and wherein said printing means is adapted to print said cumulated total of rotations after a period of time no longer than said predetermined continuous time interval of said peak demand meter, whereby the number of rotations during said period of time can be ascertained; and said printing means being adapted to be activated by said timing means to print out the time together with said cumulated total of rotations whereby electric usage for said time period can be ascertained and wherein determination of electric usage during said period of time by said device determines the accuracy of the peak demand meter.

2. The device of claim 1 wherein said sensor comprises an optical scanner which senses changes in the reflective index of said disc with said sensor comprising a phototransistor surrounded by optical fibers through which light is transmitted and a lens positioned between said disc and said phototransistor.

3. The device of claim 2 wherein said scanner is positioned exteriorily of said meter casing.

4. The device of claim 1 wherein said timing means comprises a seven segment output clock/calendar non-multiplexed direct drive MOS IC.

5. The device of claim 1 wherein said timing means comprises a BCD output non-multiplexed clock/calendar MOS IC.

6. The device of claim 1 wherein said counting means comprises a number key and the plus key of said calculator whereby each repeated activation of said plus key, after said number key is activated, adds said number to the memory of said calculator which calculator memory comprises said memory means and wherein each signal from said sensor activates said plus key with said calculator and sensor being interfaced thereby.

7. The device of claim 6 wherein said calculator comprises activation means for printing out an entered number into said calculator without change thereof, whereby said time is entered into said calculator at the end of said predetermined period as said entered number and is printed out.

8. The device of claim 6 wherein said calculator comprises activation means for printing out said cumulated memory and erasing it upon said printing.

9. The device of claim 7 wherein said means for printing out the time further functions to print out the calendar date during the day.

10. The device of claim 1 wherein said timing means comprises a non-multiplexed clock/calendar MOS IC and wherein said timing means is interfaced with said calculator by multiplexing a BCD output from said MOS IC to a BCD one-of-ten decoder which is in turn connected to activate numerical keys 0–9 of said calculator.

11. The device of claim 9 wherein said timing means comprises a non-multiplexed clock/calendar MOS IC and wherein said timing means is interfaced with said calculator by multiplexing a BCD output from said MOS IC to a BCD one-of-ten decoder which is in turn connected to activate numerical keys 0–9 of said calculator.

12. The device of claim 11 wherein the printout of said time and said date is distant from the portion of the printout containing said cumulated total.

* * * * *